United States Patent
Hollin et al.

(10) Patent No.: US 12,512,327 B2
(45) Date of Patent: Dec. 30, 2025

(54) SURFACE MODIFICATION TO ACHIEVE SELECTIVE ISOTROPIC ETCH

(71) Applicant: TOKYO ELECTRON LIMITED, Tokyo (JP)

(72) Inventors: Jonathan Hollin, Albany, NY (US);
Matthew Flaugh, Albany, NY (US);
Subhadeep Kal, Albany, NY (US);
Aelan Mosden, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 484 days.

(21) Appl. No.: 17/945,897

(22) Filed: Sep. 15, 2022

(65) Prior Publication Data

US 2024/0096639 A1    Mar. 21, 2024

(51) Int. Cl.
*H01L 21/311* (2006.01)
*H01L 21/67* (2006.01)

(52) U.S. Cl.
CPC .. *H01L 21/31116* (2013.01); *H01L 21/67109* (2013.01)

(58) Field of Classification Search
None
See application file for complete search history.

(56) References Cited

U.S. PATENT DOCUMENTS

| | | |
|---|---|---|
| 2017/0271165 A1 | 9/2017 | Kal et al. |
| 2019/0131189 A1 | 5/2019 | Doornbos et al. |
| 2020/0027741 A1 | 1/2020 | Kal et al. |
| 2020/0098575 A1 | 3/2020 | Takahashi et al. |
| 2022/0254645 A1 | 8/2022 | Luan et al. |

FOREIGN PATENT DOCUMENTS

WO    WO-2017151958 A1 *  9/2017  ........ H01J 37/32357

OTHER PUBLICATIONS

International Search Report and Written Opinion, PCT Application No. PCT/US2023/029506, mailed Nov. 21, 2023, 10 pages.

* cited by examiner

*Primary Examiner* — Stephanie P Duclair
(74) *Attorney, Agent, or Firm* — Slater Matsil LLP (57) ABSTRACT

A surface of a substrate is modified, where the substrate includes at least two different layers or films of different materials. The modified layer is then selectively converted to a protection layer on one of the layers, while the other layer is etched.

19 Claims, 4 Drawing Sheets

SURFACE MODIFICATION TO ACHIEVE SELECTIVE ISOTROPIC ETCH

TECHNICAL FIELD

The invention relates to processing of a substrate and related apparatus, particularly in which a plasma etch or gas phase etch is used for a portion of the process.

BACKGROUND

Etching of semiconductor materials often requires one material to be etched selectively (or with respect to) another material while both are disposed in the same environment, such as a plasma or gas phase chemical etch environment. Selective etching can be particularly challenging in that during certain parts of a manufacturing flow, a first material might need to be selectively etched relative to a second material, while in a different part of the process, a different etch selectivity might be needed, including selective etching of the second material relative to the first material, or selective etching of another material with respect to the first and/or second material. In addition, selective etching can be problematic in complicating the overall process due to the challenges of increasingly small device and layer sizes, the requirement for precision in etching, and the need to avoid damage.

SUMMARY

The invention provides an advantageous method and related apparatus for selective etching, where an initial treatment process is provided, and thereafter, the treatment facilitates various selectivities for different materials and different combinations of materials. In an example, first and second films or layers are provided on a substrate, with the first and second films formed of different materials, each including silicon. The treatment is provided on both of the films to provide a modified surface on both of the films. In an example, the treatment is performed in a non-plasma environment, and is followed by a heat treatment. After the heat treatment, in subsequent etch processing, the modified surface is selectively converted into a protection layer or etch stop layer on the surfaces of one of the materials, while the other material is etched (in a plasma etch chemistry or a gas phase etch chemistry), to thereby provide selective etching. The initial treatment and/or the etch processing can be modified to yield various selectivity combinations.

DETAILED DESCRIPTION

Aspects and advantages of the invention will be apparent from the description herein. It is to be understood that, in practicing the invention, certain aspects or advantages could be utilized without using others. Therefore, the invention could be practiced using variations and/or subsets of features or advantages of the examples described herein.

An example is described with respect to an indent process, however, it is to be understood that the invention could also be utilized where selective etching of two different materials is desired for other applications. For example, aspects of present methods could be used for various n- and p-type field-effect transistor (nfet and pfet) operations, in SiGe and Si nanosheet fabrication, in a channel release or channel trim, in a breakthrough process step, or removing of an oxide layer. Methods described herein can improve the functionality of a surface for subsequent processing, for example to improve selectivity or impart selectivity, as well as to avoid or reduce damage. In addition, methods described herein can render a surface hydrophobic, so that a subsequent step can more effectively etch, e.g., a silicon oxide with hydrogen, oxygen and fluorine containing gases, for example with aerosolized $H_2O$ and a fluorine containing gas. In addition, although examples of materials are described herein, it is to be understood that alternate materials could also be utilized. Further, in some examples, elements or materials are described as not being present. This is to be understood as meaning that such elements or materials are not intentionally introduced, however, trace amounts could be present depending upon the purity of materials utilized, and/or as a result of degassing or the release of elements from other materials during processing.

Disclosed examples can provide selective isotropic etching of different materials and different combinations of materials with respect to each other.

In an example, an initial surface treatment is provided for each of at least two layers or two films (first and second films). Preferably, the treatment is a non-plasma, gas phase treatment. As used herein, a gas phase is used to mean a non-plasma processing unless otherwise specified, however, the gas phase can include, for example, aerosolized components, such as aerosolized water, and/or vapor phase components could also be used. After the initial treatment, a modified surface results and is provided on the surfaces of the films, for example, on side surfaces of both of the films. The modified surface is then selectively converted to a protective surface or protective layer on one of the films, while the other film is etched, to thereby provide selective etching of the unprotected film with respect to the protected film. By varying which material is selectively converted or left unprotected, different etch selectivities for different materials can be provided. In addition, in certain examples, different etch selectivities can be provided for different materials while utilizing the same or substantially the same pre-treatment or surface modification step. A further array of combinations of selectivities can be provided by modification to the pre-treatment and/or the subsequent etch processing.

Although the films are formed of different materials, in an example, each of the films will be a silicon containing film, where at least two films of different materials are provided. For example, a first film can include an epitaxial silicon, polysilicon, silicon oxide (of varying qualities or types), or silicon germanium (SiGe). The second film can be selected from the same group but will be different from the first film. The two different films could also include two different silicon oxide films. One of the films can also be a silicon nitride film.

Figure 1A:
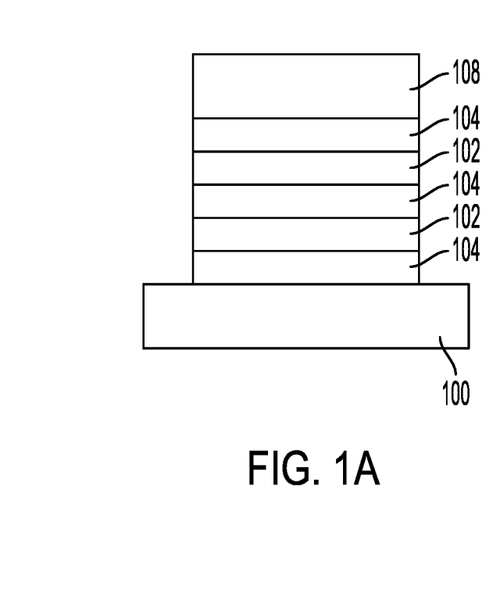
FIGS. 1A-1C, illustrate a treatment or surface modification and etching method.
Figure 1B:
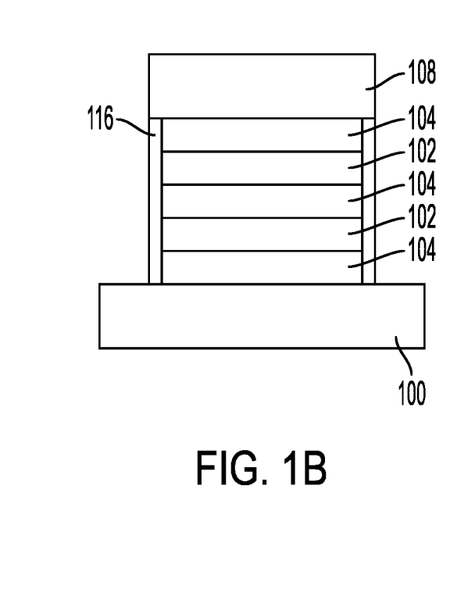
Figure 1C:
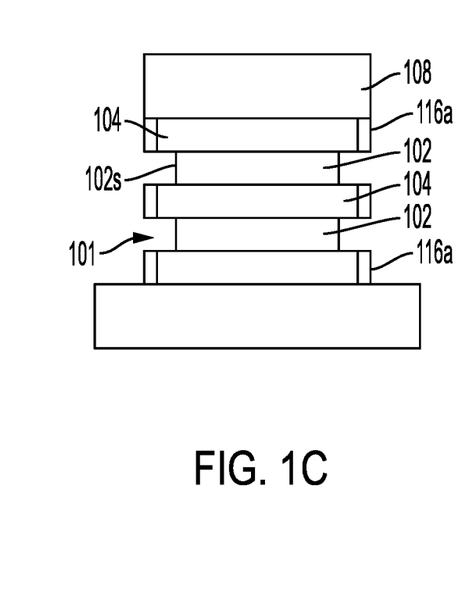

Referring to FIGS. 1A-1C, an example of an embodiment will be described. In the initial structure of FIG. 1A, the substrate will include a semiconductor base 100 which can include, for example, a wafer or substrate base, as well as additional layers on the substrate base that are below the materials being processed as described herein. The materials being processed in this example will include at least a first film 104 and a second film 102, provided in an alternating fashion. In addition, a mask 108 can be present, with the mask formed, for example, of SiN, an inorganic material, or a low-k material. Although two films are illustrated at 102, 104, it is to be understood that other films could also be present. In the example, at least one of the films 102, 104 is vertically above another of the films, and plural films can be provided in an alternating arrangement. In addition, the films will be formed of different materials, with each of the films or layers, 102, 104 being a silicon containing film. For example, the first film, 104 can be formed of epitaxial silicon, polysilicon, a silicon oxide, or silicon germanium (SiGe). The second film 102 can also be formed, for example, of epitaxial silicon, polysilicon, silicon oxide, or SiGe, where the second film is formed of a different material than the first film. In another example, one of the films can be a silicon nitride film.

In an initial treatment step, a modified surface 116 is formed on side surfaces of the first and second films as illustrated in FIG. 1B. In a preferred example, the modified surface is formed in a gas phase, non-plasma environment in which gases including hydrogen, fluorine and oxygen are introduced. For example, the treatment gases can include HF, aerosolized $H_2O$, and a carrier gas such as argon and/or nitrogen. In an example, as a result of the treatment, the modified surface will include hydrogen, silicon, and fluorine. In addition, if one of the films includes Ge (e.g., SiGe), the modified surface will typically also include Ge in the region of that layer or film, so that the modified surface includes hydrogen, silicon, fluorine and germanium.

According to an example, the first film can include an epitaxial silicon, and the second film can include silicon germanium (SiGe), and the treatment will provide a modified surface 116 on side surfaces of both layers, with the modified surface including H, Si, F and Ge on side surfaces of the SiGe layer, while the modified surface on side surfaces of the epitaxial silicon layer will include H, Si and F. As noted earlier, the treatment environment will include gases introduced which can include hydrogen, fluorine and oxygen, as well as a carrier gas, such as nitrogen and/or argon. The gas phase treatment duration can vary, but preferably is at least 10 seconds. The gas phase treatment can be at a temperature in a range from −20° C. to 200° C. and at a pressure in a range of 10 mTorr to 4 Torr. For example, where one of the films is epitaxial silicon and the other film is SiGe, temperatures can preferably be in a range from 0° C. to 35° C., with a pressure in a range of 1 Torr to 4 Torr. Examples of gas flow rates can be 200 sccm to 1000 sccm aerosolized $H_2O$; 300 sccm to 1000 sccm HF, and 100 sccm to 450 sccm $N_2$. Another fluorine containing gas or a halogen containing gas could also or alternately be used, and an alternate carrier gas, such as argon, could also be used. Further, although aerosolized $H_2O$ is provided in a preferred example, the water could be provided in a different form, such as, in a vapor form. Alternate gases could also be utilized to provide gases containing hydrogen and oxygen. Aerosolized $H_2O$ is presently preferred. In some examples herein, gases present during the treatment will include at least hydrogen, oxygen, and fluorine, and typically also a carrier gas such as argon and/or nitrogen.

After the treatment to form the modified surface, an optional but preferred heat treatment is then also performed, primarily to remove residual water or water vapor. The heat treatment is preferably performed in an inert atmosphere (e.g., including nitrogen and/or argon, but without a reactive gas, for example, without a halogen gas). For example, the heat treatment can be at a temperature in a range from 100° C. to 350° C., for example, 100° C. to 300° C., and preferably 100° C. to 250° C., with a pressure in a range of 1 Torr to 3 Torr. Preferably, during the heat treatment, flows of gases including hydrogen, fluorine (or another halogen) and oxygen are discontinued.

After the formation of the modified surface 116 and heat treatment, the modified surface is selectively converted into a protective surface, as illustrated at 116a. In the illustrated example, the modified surface 116, is converted into the protective surface or protective layer 116a adjacent to the first film 104, and the second film 102 is etched selective to the first film to provide an indentation in the second film 102, so that the second film has an outer dimension which is smaller than an outer dimension of the first film. However, the selective conversion of the modified film to the protective film and selective etching could be reversed, for example, with the modified surface converted to a protective surface or protective layer on side surfaces of the second film 102, and selective etching of the first film 104 to indent the first film relative to the second film.

Regarding the modified surface 116 on films or layers that are later to be etched, the modified surface 116 could be removed or partially removed during the heat treatment step (prior to the plasma etch or a gas phase etch) so that only portions of the film 116 that remain during the plasma etch process or gas phase etch are portions of layer 116 (or modified surface 116) that will then become the protective surface or protective layer 116a. Alternately, if portions of the modified surface 116 adjacent the film or layer to be etched are present after the heat treatment, they are then removed in the plasma or gas phase etch process and the plasma process then etches the film or layer being indented. Due to the nature of the surface modification, in the region of the layer to be etched, it will either sublimate in the heat treatment (or partially sublimate) or will be removed in the etching.

As an example, where the film being indented (etched) includes SiGe and the film being protected includes epitaxial silicon, the etch gas chemistry can include fluorine (F) and a carrier gas such as argon in a gas phase etch. In an example, the gas chemistry does not include nitrogen, and also preferably will not include both nitrogen and hydrogen, as such gases could form nitrides on surfaces of the SiGe layer or film which could inhibit etching. Conversely, if the SiGe layer is to be protected, and the epitaxial silicon layer will be etched, the plasma etch gas chemistry can include F, N and H, and the modified surface can be converted into a germanium nitride surface which will protect the SiGe layer or film, and the epitaxial silicon can be etched selective to the SiGe film.

In an example in which a SiGe layer is to be protected with a surface 116a or protective layer 116a and Si is to be etched, an initial portion of the plasma process (e.g., for 5 to 25 seconds, preferably 8 to 20 seconds, more preferably 10 to 15 seconds) can be performed in which fluorine (or another halogen) is not introduced, while N and H are introduced, thereby converting the modified surface 116 to the protective surface or protective layer 116a, and thereafter, in a second part of the plasma process, fluorine (or another halogen) can be introduced while the introduction of nitrogen and hydrogen continues, and the silicon containing layer (epitaxial silicon in this example) is etched. The first part (or first plasma) of the process can be continuous with the second part (or second plasma), with the difference being that the halogen (e.g., fluorine) is introduced for the second part. The protective surface or protective layer 116a includes germanium nitride which protects the SiGe layer during the etching of the epitaxial silicon layer. The flow of the hydrogen or halogen containing gas can be periodically discontinued for a period of time as etching progresses, while the flow of other gases (such as nitrogen and hydrogen) can continue to thereby provide additional protection or passivation of newly exposed surfaces (as the indentations are formed, thereby exposing surfaces on the top and bottom of the film protected that face the indentation as shown at FIG. 1C). For example, after the first plasma without a halogen, followed by processing with a plasma which includes a halogen (with the second part being, e.g., for 5 to 30 seconds, preferably 8 to 25 seconds), the flow of the halogen and/or plasma generation power can be discontinued for a period of time (e.g., for 8 to 20 seconds, preferably 10 to 15 seconds) while the flow of hydrogen and nitrogen continues, followed by resumption of processing with the halogen (fluorine) introduced and plasma generating power applied.

A single-step etch (without periodic discontinuing of the fluorine or halogen containing gas) could also be used. In addition, where a two-step etch is used, the first and second steps can be alternated a predetermined number of times, or a number of times based on one or more sensed parameters (e.g., amount of etching measured or detected, total etch time). Further, with either a one or two-step etch, the initial modification could also be periodically repeated.

In the above examples, the same pre-treatment (gas phase) can be advantageously used for both selectively etching epitaxial silicon with respect to SiGe (e.g., using an H, F, and N plasma etch chemistry), and conversely for selectively etching SiGe with respect to epitaxial silicon (e.g., using an F and Ar etch chemistry, e.g. in a non-plasma gas phase etch), with the etch selectively improved for both as a result of the pre-treatment.

This can be advantageous where a substrate may have different features or devices in different regions of the substrate. For example, a substrate might have a first region which includes a first device or first set of devices in which an epitaxial silicon or other silicon layer forms a channel and a germanium layer or SiGe is then indented and later released (removed), and a second region which includes a second device or second set of devices in which a germanium or SiGe layer forms a channel and a silicon layer such as epitaxial silicon is indented and later released. With an example of the present invention, the same surface modification can be used for both devices and both regions of the substrate. Thereafter, different etch steps can be used for the different devices or regions, while the device not being etched is covered, for example, with an organic material such as an OPL. Advantageously, the selectivity of both etches is improved by the pre-etch treatment.

Although the presently disclosed methods can be applied where one or two layers include a metal, according to some examples, one or both of the films or layers 102, 104 do not include a metal, and preferably the treatment gases and/or the etch process gases do not include a metal.

In another example, the first and second films can be different silicon oxides, for example the first film can be a thermal oxide or TEOS, and the second layer can be an ALD oxide (atomic layer deposition silicon oxide). These can be etched relative to each other using the same pre-etch treatment as described herein. During the etch (after the pre-etch modification as discussed earlier herein), the fluorine containing gas is introduced in a range from 500 sccm to 1500 sccm, with the etch gases also including aerosolized $H_2O$ in a range from 100 sccm to 1000 sccm, preferably 200 sccm to 1000 sccm, and a carrier gas (nitrogen and/or argon, e.g., 50 to 500 sccm, preferably in a range of 100 sccm to 450 sccm). This will provide selective etching of the ALD oxide selective to (relative to) the thermal oxide in a gas phase etch.

According to another example, the second layer or film can include a silicon oxide, and the first film can include a silicon nitride or a low-k dielectric. For example, the low-k dielectric (before treatment) can include one or more of silicon, oxygen, carbon and hydrogen (e.g., SiCOH). The pre-treatment can be as described earlier for temperature and pressure. Fluorine containing gas can be introduced in a range of 500 sccm to 1500 sccm, aerosolized $H_2O$ in a range from 100 sccm to 500 sccm, with a carrier gas in a range of 800 sccm to 2000 sccm, in an example. A heat treatment can then be performed as discussed earlier. The etch process can include fluorine containing gas (10 sccm to 300 sccm, for example) a catalyst containing gas such as $NH_3$ (20 sccm to 300 sccm, for example), and a carrier gas such as argon (50 sccm to 500 sccm), with a pressure preferably in a range of 20 mTorr to 800 mTorr and a temperature preferably in a range of 20° C. to 140° C., in a gas phase etch.

In another example, the first film can be a thermal oxide or TEOS, and the second film can be SiN. In this example, SiN can be etched with respect to the thermal oxide, with a pre-treatment preferably including a fluorine containing gas of 300 sccm to 800 sccm, aerosolized $H_2O$ from 100 sccm to 500 sccm, with a carrier gas (e.g., nitrogen and/or argon) of 20 sccm to 500 sccm, and temperature and pressure as in the preceding example. A heat treatment can be as previously described. The main etch can be a plasma etch, e.g., with an RF power from 400 watts to 800 watts, preferably with a remote plasma, with process gases including hydrogen (10 sccm to 100 sccm), oxygen (100 sccm to 600 sccm), and a fluorine containing gas (10 sccm to 75 sccm), a pressure from 50 mTorr to 500 mTorr, and a temperature in a range from 10° C. to 90° C., to provide highly selective etching of SiN relative to the thermal oxide, with improved selectivity provided by the pre-etch treatment.

Table 1 further summarizes Examples 1-11 in which the present methods are used. In Table 1, Film 2 is the layer or film being selectively etched. In other words, Film 2 is etched preferentially (or at a higher etch rate) with respect to Film 1. For example, Film 2 corresponds to layer 102 and Film 1 corresponds to layer 104 in the example of FIGS. 1A-C. Table 1 identifies the process conditions for the modification and also the subsequent etch. As indicated, according to the examples, the modification is a gas phase (as indicated in brackets), whereas the etch can be a gas phase or a plasma etch (also indicated in brackets). Gas flow rates of gases used in an example are set forth in Table 1, and examples of other (alternate or additional) gases are also listed.

TABLE 1

| Example | Film 1 | Film 2 | Modification [Gas/Plasma] | Etch (Film 2: Film 1) [Gas/Plasma] |
|---|---|---|---|---|
| 1 | Si | SiGe | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 400-1000 sccms HF, 100-500 sccms N2 | [Gas] Halogenated Gas (F2, HF etc.), Neutrals (Ar, N2) Temp: −20-150 C. Pressure: 10-300 mTorr Gas Flows: 500-1500 sccms F2, 50-250 sccms N2 |
| 2 | SiGe | Si | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 400-1000 sccms HF, 100-500 sccms N2 | [Plasma] Halogen Gas (ex. NF3, F2, etc.), Nitrogen containing species (N2, NH3, etc.), Hydrogen containing species (H2, NH3, etc.), and Neutral (Ar) Temp: −50-100 C. Power: 200-900 W Pressure: 50-750 mTorr Gas Flows: 10-100 sccms NF3, 100-750 sccms N2, 20-250 sccms H2, 50-1000 sccms Ar |
| 3 | Si | SiOx | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 10-200 sccms HF, 100-500 sccms N2 | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 400-1000 sccms HF, 100-500 sccms N2 |
| 4 | SiOx | Si | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 400-1000 sccms HF, 100-500 sccms N2 | [Plasma] Halogen Gas (ex. NF3, F2, etc.), Nitrogen containing species (N2, NH3, etc.), Hydrogen containing species (H2, NH3, etc.), and Neutral (Ar) Temp: −50-100 C. Power: 200-900 W Pressure: 50-750 mTorr Gas Flows: 10-100 sccms NF3, 100-750 sccms N2, 20-250 sccms H2, 50-1000 sccms Ar |
| 5 | Si | SiN | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 400-1000 sccms HF, 100-500 sccms N2 | [Plasma] Halogen Gas (ex. NF3, F2, etc.), Nitrogen containing species (N2, NH3, etc.), Hydrogen containing species (H2, NH3, etc.), Oxygen containing species (O2, NO, etc.), and Neutral (Ar) Temp: 10-100 C. Power: 200-1000 W Pressure: 100-600 mTorr Gas Flows: 10-100 sccms H2, 100-500 sccms O2, 10-75 sccms NF3, 100-250 sccms Ar |
| 6 | SiN | Si | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 400-1000 sccms HF, 100-500 sccms N2 | [Plasma] Halogen Gas (ex. NF3, F2, etc.), Nitrogen containing species (N2, NH3, etc.), Hydrogen containing species (H2, NH3, etc.), and Neutral (Ar) Temp: −50-100 C. Power: 200-900 W Pressure: 50-750 mTorr Gas Flows: 10-100 sccms NF3, 100-750 sccms N2, 20-250 sccms H2, 50-1000 sccms Ar |

TABLE 1-continued

| Example | Film 1 | Film 2 | Modification [Gas/Plasma] | Etch (Film 2: Film 1) [Gas/Plasma] |
|---|---|---|---|---|
| 7 | SiN | SiOx | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 10-200 sccms HF, 100-500 sccms N2 | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 400-1000 sccms HF, 100-500 sccms N2 |
| 8 | SiOx | SiN | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 10-200 sccms HF, 100-500 sccms N2 | [Plasma] Halogen Gas (ex. NF3, F2, etc.), Hydrogen containing species (H2, NH3, etc.), Oxygen containing species (O2, NO, etc.), and Neutral (Ar) Temp: 10-90 C. Power: 200-1000 W Pressure: 100-600 mTorr Gas Flows: 10-100 sccms H2, 100-500 sccms O2, 10-75 sccms NF3, 100-250 sccms Ar |
| 9 | SiOx (Thermal) | Si Ox (ALD) | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 10-200 sccms HF, 100-500 sccms N2 | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 400-1000 sccms HF, 100-500 sccms N2 |
| 10 | SiGe | SiOx | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 10-200 sccms HF, 100-500 sccms N2 | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 400-1000 sccms HF, 100-500 sccms N2 |
| 11 | SiOx | SiGe | [Gas] Acid (ex. HF, HCl, H2SO4, etc.), Hydroxide (ex. H2O, OH, etc.), and Neutral (Ar, N2) Temp: 10-50 C. Pressure: 1-6 Torr Gas Flows: 100-1000 sccms H2O, 10-200 sccms HF, 100-500 sccms N2 | [Gas] Halogenated Gas (F2, HF etc.), Neutrals (Ar, N2) Temp: −20-150 C. Pressure: 10-300 mTorr Gas Flows: 500-1500 sccms F2, 50-250 sccms N2 |

Figure 2:
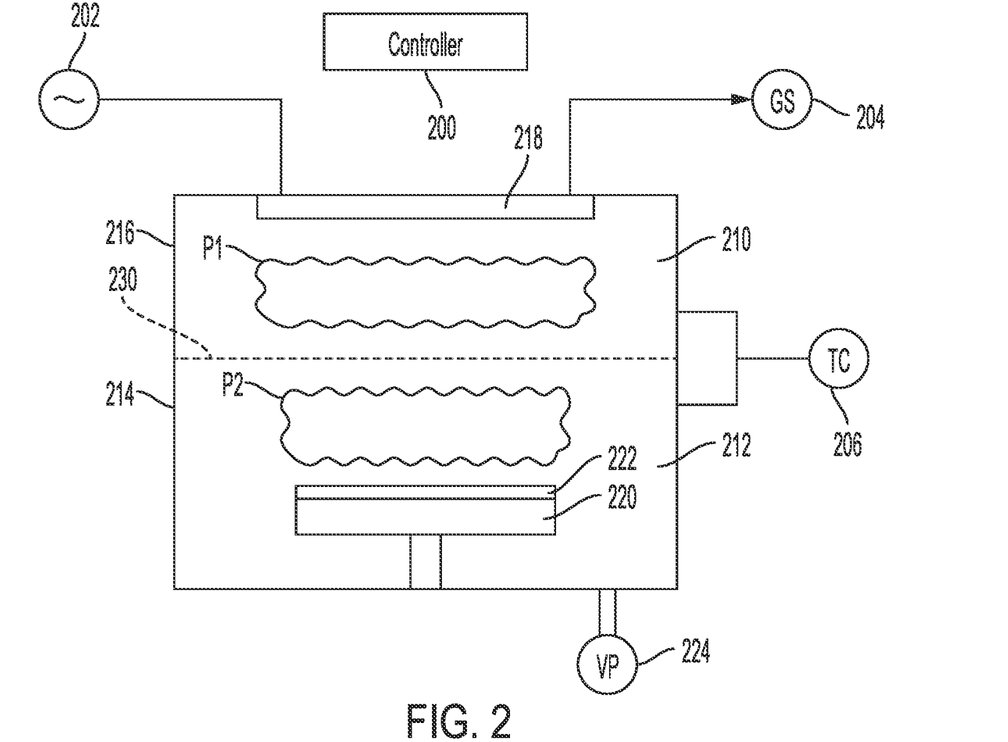
FIG. 2 is an example of an apparatus which can be used with the present invention.

FIG. 2 illustrates an example of a process chamber in which one or more of the processing operations disclosed herein can be utilized. For plasma or gas phase processing, a gas supply GS 204 is provided, which can include one or more supply lines and reservoirs or sources to contain and provide sources of the processing gases. For forming a plasma, preferably at least one power source 202 is provided which can be, for example, a radio frequency (RF) power source to supply power to an electrode 218, which can form a plasma with process gases that are introduced from the gas supply or gas source GS 204. For example, the process gases can be introduced through the electrode 218 in a showerhead arrangement, however alternatively, or in addition, process gases can be introduced at other locations. It is to be understood that the number of electrodes can vary, and also alternate plasma generation sources could be utilized, for example, with inductive or microwave power sources used to generate a plasma. In addition, for gas phase etching, the electrode and plasma generation power are not needed.

In the illustrated example, the plasma can be formed as a remote plasma, for example, with a first plasma generated as representative at P1, and as the plasma generated in the first chamber or chamber portion 210 passes to a second chamber or second chamber portion 212, ions are removed, for example, by a mesh or grid arrangement 230 which removes ions so that radicals in the plasma P2 are primarily used for plasma processing of the substrate 222 present on a substrate support 220. However, it is also to be understood that the plasma could be generated in the same chamber or chamber portion in which the substrate is present. Thus, although the use of a remote plasma so that processing of the substrate is with radicals can be preferred in some examples, it is optional and the element (e.g., a grid or mesh arrangement) 230 could be eliminated if desired. In addition, for a gas phase etch, the structure 230 is also unnecessary. The substrate 222 is mounted on a substrate support 220, which can electrostatically attract the substrate 222. Where a remote plasma is used or a gas phase etch is performed, the support 220 (and region 220) need not have plasma generating power supplied thereto. However, bias power and/or plasma generating power could also be applied to the substrate holder 220 or an electrode of the substrate holder 220 where a plasma is generated in the region in which the substrate is positioned.

A controller 200 is provided for controlling the various operations and processes as described herein. The controller 200 can include, for example, a processor or computer, and a memory which can include a non-transient computer-readable memory. It is to be understood that the controller can include a centralized controller, as well as multiple controllers or sub-controllers which can control different chambers or chamber components. Further, the controller can store recipe data and data regarding substrates or wafers, to control substrate transfer operations, and/or to update or modify processes based upon feedback or measured data of previously processed substrates (or data unique to a particular substrate, that is being processed or about to be processed).

A vacuum pump, VP 224 is provided to exhaust process gases and, in conjunction with the flow of incoming gases, can also vary the pressure within the chamber or chambers. A temperature control TC is represented at 206, and can include various temperature, heating or cooling expedients for heating and/or cooling the process chamber and/or substrate support 220. For example, electrical heating can be provided in the substrate support 220 and/or fluidic heating or cooling (or heat exchange) could also be provided in the substrate support 220. Similarly, heating and/or cooling expedients can be provided in chamber walls or chamber wall portions 214, 216, including electrical and/or fluidic cooling or heat exchange elements.

Figure 3:
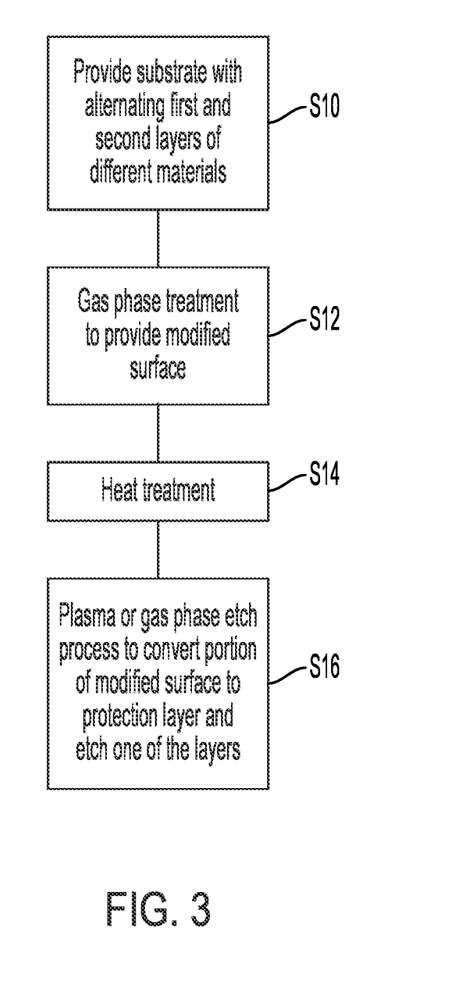
FIG. 3 is a flow chart or algorithm illustrating an example of a process.

Referring to FIG. 3, an overview of processing as disclosed herein is provided, which can be provided as an algorithm, for example, for processing controlled by a controller 200 of a processing apparatus. Although FIG. 3 illustrates an overview of the processing, further details of the processing under the control of the controller can be provided as disclosed herein.

As indicated at S10, a substrate is initially provided having first and second layers, for example, in an alternating stacked arrangement. Layers will be formed of different materials, preferably with the materials each including silicon. For example, as discussed earlier, one layer can include a material selected from the group including or consisting of epitaxial silicon, polysilicon, SiGe, or a silicon oxide, and the other layer can be formed of a different material selected from the group including or consisting of epitaxial silicon, polysilicon, SiGe, or a silicon oxide. One of the films can also include a silicon oxide and the other can include a different silicon oxide. According to an example, one of the layers or films can include a silicon nitride layer or film. According to another example, the substrate could also include different devices (e.g., different stack arrangements of materials) in different regions, for example, with one or a plurality of first devices each having first and second layers (or films) in a first region, and one or a plurality of second devices provided in a second region having third and fourth layers or films. The devices can have different layers requiring different selectivities, for example with a first layer etched relative to (selective to) a second layer in the first devices, and a third layer etched relative to a fourth layer in the second devices, and with the required selectivities different for the different devices. For example, one of the devices may require selective etching of SiGe relative to Si, while the other device requires selective etching of Si relative to SiGe. With methods herein, the same initial treatment can be provided for the first and second devices, with the first, second, third and fourth layers exposed to the treatment. Thereafter, different etch processes can be used for the first devices compared to the second devices, for example with a plasma etch for the first devices and a gas phase non-plasma etch for the second devices, to obtain the desired etch selectivity. According to an advantage of present methods, the selectivity of both etches is improved by the pre-etch treatment according to methods disclosed herein. During etching of one device (or plurality of devices), the other could be covered with, e.g., a carbon containing layer such as an OPL.

As indicated at S12, a gas phase treatment is initially performed, so that a modified surface is provided on surfaces of each of the first and second layers, for example, on the side surfaces of the first and second layers as indicated at 116 illustrated in FIGS. 1A-C. A heat treatment is then performed as indicated at S14, to remove residues or residual water vapor. In some examples, the heat treatment could also remove portions of the modified surface 116 while other portions of the modified surface 116 are not removed by sublimation and later become a protective surface or protective layer (116a). Where the heat treatment does not remove portions of the modified surface 116 adjacent the layer to be etched, these portions are removed in the plasma or gas phase etch process S16. In the plasma process, portions of the layer that are not to be etched (or which are protected) are converted to a protective layer 116a, while the layer to be etched (102) is etched, for example, with a fluorine or halogen containing gas in the etching process.

After the etch, a heat treatment is preferred, particularly for the gas phase etch, at a temperature higher than the temperature during the etch, for example in a range from 100° C. to 250° C.

Figure 4A:
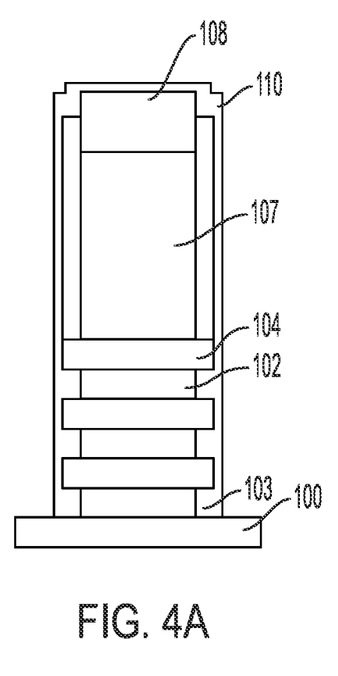
FIGS. 4A and 4B illustrate additional processing.
Figure 4B:
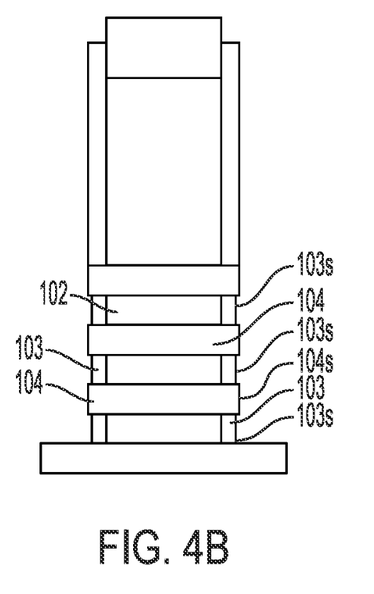

FIGS. 4A and 4B. illustrate additional processing which can occur, for example, after the indent has been formed as illustrated in FIGS. 1A-C described earlier.

The arrangement of FIGS. 4A and 4B include, for example, Ge (or SiGe) containing layers 104, with Si containing layers 102 between the layers 104, and with the Si containing layers having been indented as described earlier. The region 108 can be a mask, for example, a hard mask, and the region 107 can initially include a dummy gate, which is later removed and a gate metal deposited. After the indent process discussed earlier, a spacer layer 110 is deposited to provide an inner spacer layer 110. The layer 110 can be formed, for example, of a spacer material such as SiN or a low-k dielectric. The inner spacer layer 110 is then partially removed, so that spacers 103 are left in what previously was formed as the indents or indentations discussed earlier. The layers 102 can then be removed (channel release) so that channels 104 are left formed of the Ge or SiGe containing layers, and the regions previously occupied by the dummy gate 107 and the Si containing layers 102 can then be filled with a gate metal. In addition, in removing or etching of the inner spacer layer 110 to leave the spacers 103, the spacers 103 should be indented with respect to the outer surface of the Ge or SiGe containing layer or channel 104, so that an outer surface of the spacer 103s of the spacer has an outer dimension which is smaller than the outer surface or outer dimension 104s of the layer 104.

Although the present invention has been discussed earlier with respect to etching to form the indentation, the invention could also be utilized, for example, for a channel release, in removing layer 102 (FIGS. 4A and 4B) while protecting the layer 104 (for example, a SiGe layer). As another alternative, the invention could be applied to etch the spacer material 103 selective to or with respect to layer 104 (while protecting layer 104), so that the remaining portions of the inner spacer layer 110 are etched and an indented outer surface 103s of the spacers is indented with respect to the outer surface 104s of the Ge containing layer (or SiGe).

It is to be understood that other applications can be utilized which include features of examples as disclosed herein. For example, methods could be applied to liner removal, mask removal or mask trim, channel trim, or other processing operations where selective etching is desired.

Although this disclosure describes particular process/method steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

The invention claimed is:

1. A method of selective etching comprising:
providing a substrate having a film stack thereon which includes first and second films, where one of the first film or the second film is vertically above another of the first film or the second film;
the first film being formed of a material different from the second film, and the first and second films each comprise one of epitaxial silicon, polysilicon, silicon oxide, silicon germanium, or silicon nitride, the first and second films each including side surfaces;
treating the side surfaces of the first and second films to form a first modified surface on the first film and a second modified surface on the second film, wherein the treating is a gas phase non-plasma treatment with gases that include hydrogen, fluorine and oxygen; and
after the treating, performing a plasma etch process which converts the first modified surface to a protective surface and which etches the second film selective to the first film to remove portions of the second film.

2. The method of claim 1, wherein the plasma etch process etches the second film to form indentations in the second film so that an outer dimension of the second film is smaller than an outer dimension of the first film.

3. The method of claim 1, wherein the gases in the treating comprise HF, aerosolized $H_2O$ and a carrier gas.

4. The method of claim 3, wherein the treating is performed at a temperature in a range from −20° C. to 200° C., and at a pressure from 10 mTorr to 4 Torr.

5. The method of claim 4, wherein the treating is performed at a temperature in a range from 0° C. to 35° C.

6. The method of claim 5, further including, after the treating and prior to the etch, performing a heat treatment at a temperature in a range from 100° C. to 350° C.

7. The method of claim 1, wherein the film stack including the first and second films form one of a first plurality of devices in a first region of the substrate, the substrate further including a second plurality of devices in a second region of the substrate, and wherein both of the first plurality of devices and the second plurality of devices are exposed to the treating;
wherein the etch process is a plasma etch performed on the first plurality of devices but not on the second plurality of devices; and
wherein the second plurality of devices are exposed to a gas phase non-plasma etch after the treating.

8. A method of selective etching comprising:
providing a substrate having first and second films thereon, one of the first and second films being vertically above another of the first and second films, wherein the first film is formed of a different material than the second film and each of the first and second films includes silicon, the first and second films each having side surfaces;
treating the substrate to form a first modified surface on side surfaces of the first film and a second modified surface on side surfaces of the second film, the treating being performed in a non-plasma environment with treatment gases; and
performing an etch process which converts the first modified surface to a protective layer, removes the second modified surface, and etches the second film so that the second film is indented with respect to the first film, the etch process being a plasma etch process.

9. The method of claim 8, wherein:
the first film is formed of a first material selected from the group consisting of: epitaxial silicon, polysilicon, silicon germanium, silicon nitride and silicon oxide; and
the second film is formed of a second material different from the first material and is selected from the groups consisting of: epitaxial silicon, polysilicon, silicon germanium, silicon nitride and silicon oxide.

10. The method of claim 8, wherein the treating is in a non-plasma environment at a temperature in a range from −20° C. to 200° C. and at a pressure in a range from 10 mTorr to 4 Torr.

11. The method of claim 8, wherein the treating is performed in a non-plasma environment, with treatment gases which include a halogen, oxygen, and hydrogen.

12. The method of claim 8, wherein the treatment gases include aerosolized $H_2O$, HF, and a carrier gas.

13. The method of claim 8, further including raising a temperature of the substrate to perform a heat treatment after the treating and before the etch process, the heat treatment performed at a temperature in a range for 100° C. to 300° C. and in an environment in which a halogen is not introduced.

14. The method of claim 13, wherein during the etch process, a halogen and a carrier gas are introduced and nitrogen is not introduced.

15. The method of claim 13, wherein during the etch process, a halogen, nitrogen and hydrogen are introduced.

16. The method of claim 8, wherein the treating is performed with gas flow rates of HF in a range from 300 sccm to 1000 sccm, and aerosolized $H_2O$ in a range from 200 sccm to 1000 sccm, and wherein a carrier gas including argon and/or nitrogen is also introduced.

17. The method of claim 8, wherein the substrate includes a first plurality of devices and a second plurality of devices, and each of the first plurality and the second plurality of devices is exposed to the treating, and after the treating, the first plurality of devices is exposed to a gas phase non-plasma etch and the second plurality of devices is exposed to a plasma etch.

18. A method of selective etching comprising:
providing a substrate including a first plurality of devices in a first region and a second plurality of devices in a second region, the first plurality of devices including a first layer and a second layer, the first layer formed of a different material than the second layer, the second plurality of devices including a third layer and a fourth layer, the third layer formed of a different material than the fourth layer;

treating the first and second pluralities of devices with a non-plasma gas phase chemistry which includes hydrogen, a halogen, and oxygen;

after the treating, exposing the first plurality of devices to a plasma etch process to selectively etch the first layer with respect to the second layer; and after the treating, exposing the second plurality of devices to a gas phase non-plasma etch to selectively etch the third layer with respect to the fourth layer.

19. The method of claim 18, wherein the plasma etch process selectively converts a portion of a treated surface on the second layer to a protective surface that protects the second layer during etching of the first layer, and wherein the gas phase non-plasma etch selectively removes a portion of the treated surface on the fourth layer while maintaining another portion of the treated surface as a protective surface on the third layer.

* * * * *